United States Patent [19]

Hasegawa et al.

[11] Patent Number: 4,553,264
[45] Date of Patent: Nov. 12, 1985

[54] DOUBLE SUPERHETERODYNE TUNER

[75] Inventors: Makoto Hasegawa; Hiroshi Ohnishi, both of Tokyo; Sadahiko Yamashita, Sagamihara, all of Japan

[73] Assignee: Matsushita Electric Industrial Co., Ltd., Osaka, Japan

[21] Appl. No.: 533,810

[22] Filed: Sep. 19, 1983

[30] Foreign Application Priority Data

Sep. 17, 1982 [JP] Japan .............................. 57-162503
Jul. 28, 1983 [JP] Japan .............................. 58-138015

[51] Int. Cl.$^4$ .............................................. H04B 1/26
[52] U.S. Cl. .................................... 455/189; 333/206; 455/197; 455/315
[58] Field of Search ............................. 455/314–316, 455/189, 197, 131, 190; 333/206, 207; 358/191.1; 331/38, 39

[56] References Cited

U.S. PATENT DOCUMENTS 4,340,975 7/1982 Onishi et al. .......................... 455/315
4,353,132 10/1982 Saitoh et al. ......................... 455/315
4,437,076 3/1984 Makimoto et al. ................. 333/206

FOREIGN PATENT DOCUMENTS

56-144642 11/1981 Japan .

Primary Examiner—Marc E. Bookbinder
Attorney, Agent, or Firm—Lowe, King, Price & Becker

[57] ABSTRACT

In a double superheterodyne tuner, the first local oscillator frequency is set to a value higher than the first intermediate frequency, which is set to a value between three and five times the upper limit of the receiving frequency range. With this arrangement spurious signals of at least third or less order can be prevented from occuring in the first intermediate frequency range. The tuner comprises an input filter which attenuates interference signals whose harmonics equal a desired frequency. The second intermediate frequency may be selected such that it is obtained by subtracting the second local oscillator frequency from the first intermediate frequency which is higher than the second local oscillator frequency. As a bandpass filter for passing the first intermediate frequency may be used a coaxial dielectric filter so as to reduce interferences by undesired channel signals.

7 Claims, 8 Drawing Figures

DOUBLE SUPERHETERODYNE TUNER

BACKGROUND OF THE INVENTION

This invention relates generally to tuners used in television receivers or the like, and more particularly, the present invention relates to such a tuner of double superheterodyne system used for VHF and/or UHF band.

In conventional VHF television (TV) receivers, so called electronic tuners of single superheterodyne system are widely used. However, such a conventional tuner is capable of receiving only a relatively narrow frequency range, and therefore, it is necessary to employ two different tuners for converting both VHF and UHF bands. Furthermore, switching diodes are usualy used to change the receiving frequency range in VHF band so as to effect switching between VHF low band and high band. Moreover, such a conventional tuner suffers from unstable output characteristics, and therefore, it cannot be used as a tuner of CATV because it is necessary to process the receiving signal.

In order to remove the above-described drawbacks in conventional tuners, an improved all channel tuner of double superheterodyne system was recently divised. In such a known double superheterodyne system, the first intermediate frequency is usually to 600 MHz or so for receiving a CATV band ranging from 50 to 450 MHz. While this improved tuner, although the above-mentioned drawbacks have been removed, there arises a problem that spurious signals are apt to appear in the first intermediate frequency band, resulting in beat interference which appears as noises in a reproduced picture on a TV CRT. According to another known double superheterodyne system disclosed in Japanese Patent Provisional Publication No. 56-144642 or in a corresponding U.S. Pat. No. 4,340,975, the first intermediate frequency is set to a value higher than 2500 MHz so that undesirable spurious signals are suppressed. However, due to such an extremely high first intermediate frequency circuit elements are expensive, while there are various problems in manufacturing techniques, and therefore such a double superheterodyne tuner is not practical.

SUMMARY OF THE INVENTION

The present invention has been developed in order to remove the above-described drawbacks inherent to the conventional tuners.

It is, therefore, an object of the present invention to provide a new and useful double superheterodyne tuner which is capable of suppressing spurious signals effectively.

According to a feature of the present invention the first intermediate frequency is selected to a value between three and five times the upper limit of the receiving frequency range, while the first intermediate frequency signal is obtained by substracting a desired frequency from a first local oscillator frequency which is higher than the first intermediate frequency. Furthermore, an input filter is employed at an input stage of the tuner for reducing interference signals resulting in spurious signals, beat interference or the like, where the filter has a variable frequency response which can be changed in accordance with a desired tuning frequency.

Furthermore, the method of mixing at a second mixer may be arranged such that a second oscillator frequency is subtracted from the first intermediate frequency, where the second local oscillator frequency is lower than the first intermediate frequency.

Moreover, a filter for passing the first intermediate frequency may comprise a coaxial dielectric bandpass filter for reducing interference by other channel signals.

In accordance with the present invention there is provided a double superheterodyne tuner comprising: an input filter for selectively passing a desired signal with the frequency response being changed in accordance with a desired tuning frequency; a first local oscillator for producing a first local oscillator frequency having a predetermined frequency difference from that of the desired signal; a first mixer responsive to an output signal from the input filter and the first local oscillator frequency for producing a first intermediate frequency which is larger than 3fRmax and is smaller than 5fRmax wherein fRmax is the upper limit of the receiving range of the tuner, the method of mixing by the first mixer being such that the first intermediate frequency is produced by subtracting the desired signal frequency from the first local oscillator frequency which is higher than the first intermediate frequency; a fixed-frequency filter for passing the first intermediate frequency from the first mixer; a second local oscillator for producing a predetermined second local oscillator frequency having a predetermined frequency difference from the first intermediate frequency; a second mixer responsive to an output signal from the fixed-frequency filter and the second local oscillator frequency for producing a second intermediate frequency.

BRIEF DESCRIPTION OF THE DRAWINGS

The object and features of the present invention will become more readily apparent from the following detailed description of the preferred embodiment taken in conjunction with the accompanying drawings in which.

The same or corresponding elements and parts are designated at like reference numerals throughout the drawings.

DETAILED DESCRIPTION OF THE INVENTION

Prior to describing the present invention, the above-mentioned conventional tuner arrangements will be discussed for a better understanding of the present invention.

Figure 1:
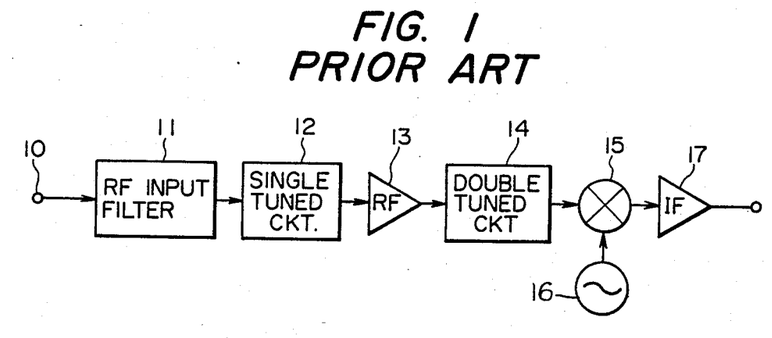
FIG. 1 is a diagram showing a conventional single superheterodyne tuner.

FIG. 1 shows a diagram showing a conventional VHF electronic tuner of single superheterodyne type. An incoming signal applied from an input terminal 10 is fed to an input filter 11 to remove interference signals, which interfere with the TV intermediate frequency, and FM broadcasting signals or the like. An output signal from the input filter 11 is fed to a single tuned circuit 12 having a varactor used as a variable frequency resonating element so that a desired channel signal is selected. Then an output signal from the single tuned circuit 12 is amplified by an RF amplifier 13 to be applied to a double tuned circuit 14 having two varactors used as variable frequency resonating elements. Thus undesired signals are removed, and the desired signal is fed to a mixer 15 in which a local oscillator signal from a local oscillator 16 is mixed therewith to be converted into an intermediate frequency signal. The intermediate frequency derived from an output of the mixer 15 is amplified by an intermediate frequency amplifier 17.

In the above-described conventional tuner, each of the single tuned circuit, double tuned circuit and the local oscillator requires a tuning varactor, while tracking has to be made for alignment of these circuits. Furthermore, since the receiving range covered by the conventional tuner of FIG. 1 is relatively small, two different tuners have to be employed for receiving both VHF and UHF bands, while the VHF tuner has to be switched to change the receiving frequency so as to receive a VHF high band and a VHF low band. Moreover, such a conventional tuner is not suitable for CATV as described at the beginning of the specification.

Figure 2:
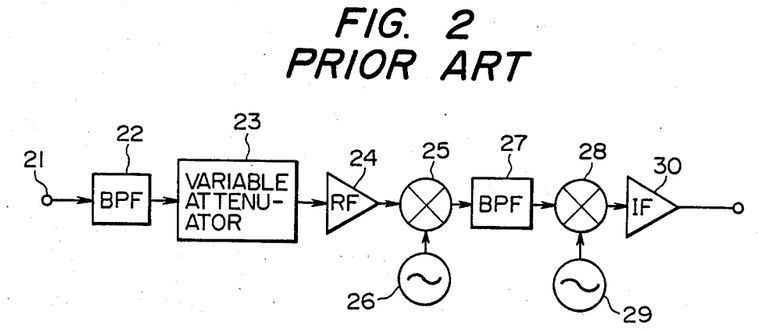
FIG. 2 is a diagram showing a conventional double superheterodyne tuner.

FIG. 2 shows a conventional double superheterodyne tuner proposed in order to remove the drawbacks inherent to the tuner of FIG. 1. It is generally known that there are two method of mixing in a first mixer of a double superheterodyne arrangement. Namely, according to one mixing method, the first intermediate frequency $f_{IF1}$ is produced as the difference between the first local oscillator frequency $f_{L1}$ and a desired receiving frequency $f_R$ as expressed by $f_{IF1}=f_{L1}-f_R$; and according to another mixing method, the first intermediate frequency $f_{IF1}$ is produced as the sum of the first local oscillator frequency $f_{L1}$ and a desired receiving frequency $f_R$ as expressed by $f_{IF1}=f_{L1}+f_R$.

In the tuner of FIG. 2, the reference 21 is an input terminal; 22, an input stage fixed-frequency bandpass filter having a necessary passband of VHF or UHF; 23, a variable attenuator; 24, an RF amplifier; 25, a first mixer for converting a desired TV channel signal among amplified high frequency incoming signals into a first intermediate frequency; 26, a variable-frequency first local oscillator for producing a local oscillator frequency having a predetermined relationship with the desired frequency. The reference 27 is a fixed-frequency bandpass filter for selectively passing the first intermediate frequency from the first mixer 25 so as to reduce interference due to other channel signals in the following circuits; 28, a second mixer for converting the first intermediate frequency into a TV intermediate frequency by mixing a second local oscillator frequency from a second local oscillator 29 with the first intermediate frequency. The reference 30 is an IF amplifier for amplifying the TV intermediate frequency from the seciond mixer 28.

In the above conventional double superheterodyne tuner, characteristic of each circuit is very important to determine the overall characteristics of the tuner, while the selection of the value of the first intermediate frequency also has an importance because spurious signal suppressing characteristic drastically chages in accordance with the value of the first intermediate frequency as will as described hereinbelow.

Although the first intermediate frequency in known double superheterodyne tuner is actually set to 600 MHz or so, let us assume that the first intermediate frequency is selected to a value between 300 MHz and 400 MHz for simplicity, while the method of mixing in the first mixer 25 is such that the difference between first local oscillator frequency $f_{L1}$ and the desired frequency $f_R$ equals the first intermediate frequency $f_{IF}$ as $f_{IF}=f_{L1}-f_R$.

Supposing unwanted channel signals other than a desired channel signal occur as interference signals, and that the frequency range of the interference signals is between 50 MHz and 450 MHz in the case of a CATV system. The interference signal frequency will be expressed in terms of $f_U$ hereafter. When receiving a desired frequency, harmonic interference such as $f_{L1}-2f_U$, $f_{L1}-3f_U$ or the like, which are converted into first intermediate frequency $f_{IF1}$ necessarily occur irrespective of the value of $f_{IF1}$. However, such interference can be removed by adding fixed-frequency bandpass filters to an input stage.

However, when the first intermediate frequency and the method of mixing in the first mixer are respectively determined as described in the above, signals expressed by $2f_U$, $2f_U-f_{L1}$, $2f_{L1}-f_U$, $2f_{L1}-2f_U$ etc become spurious signals. Since such spurious signals result from the difference between a second order harmonic or fundamental wave of the interference signal and a second or lower order harmonic of the first local oscillator, the power level of the spurious signals is relatively large.

Figure 3:
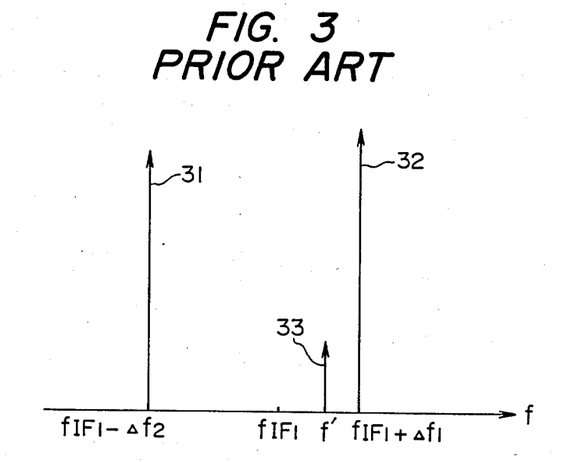
FIG. 3 is an explanatory diagram showing a spurious signal occuring in the first intermediate frequency due to unwanted channel signals.

For instance, when a desired signal frequency and a first intermediate frequency are respectively expressed in terms of $f_R$ and $f_{IF1}$, the first local oscillator frequency $f_{L1}$ is given by $f_R+f_{IF1}$. Assuming that $f_{IF1}$ is a value between 300 MHz and 400 MHz, a second or lower order harmonic of a video carrier wave of an unwanted signal $f_U$ appears within the first intermediate frequency range, in which a desired channel signal exists, due to mixing of a second or lower order harmonic of the unwanted or interference signal $f_U$ and the first local oscillator frequency. FIG. 3 shows such a state. Namely, in FIG. 3, a line 31 indicates an audio carrier signal ($f_{IF}+\Delta f_1$) of the desired channel, which has been converted into the first intermediate frequency by the first mixer 25; a line 32 indicates a video carrier signal ($f_{IF}+\Delta f_2$) of the desired channel, which has been converted into the first intermediate frequency. In the above, $\Delta f_1+\Delta f_2=4.5$ MHz. A line 33 indicates a spurious signal caused from a second or lower order hamonic of an interference signal. Namely, the spurious signal frequency is expressed by $2f_U$, $2f_U-f_{L1}$, $2f_{L1}-f_U$, or $2f_{L1}-2f_U$.

The above-described spurious signals necessarily occur when incoming TV channel signals are converted into the first intermediate frequency between 300 MHz and 400 MHz, resulting in beat interference appearing in a picture on TV CRT.

Nextly, let us consider spurious signal occuring state under an assumption that the first intermediate frequency is set to 2000 MHz, while the method of mixing is such that the first intermediate frequency $f_{IF}$ is produced as the sum of the first local oscillator frequency $f_{L1}$ and the desired frequency $f_R$.

In the above case, although harmonic spurious signals, such as $f_{L1}+2f_U$, $f_{L1}+3f_U$ etc occur within the first intermediate frequency range when receiving the desired wave, such spurious signals may be removed in the same manner as in the above. Except for the above, $2f_{L1}-3f_U$ becomes a spurious signal, where this spurious signal has a relatively large power level because it is obtained as the difference of a second harmonic of the first local oscillator frequency and a third harmonic of the interference signal. This spurious signal also falls in the first intermediate frequency range as shown in FIG. 3.

In the present invention the value of the first intermediate frequency in a double superheterodyne tuner system is selected to be lower than the first local oscillator frequency and to be a value between three and five times the upper limit of the receiving frequency range. With this arrangement, interference encountered by conventional arrangements can be removed, and it will be described how such interferences can be removed.

In the following consideration, let us assume that TV signals of channels other than a desired channel are interference signals, and the frequency range of the interference signals is between 50 and 450 MHz taking an example of a CATV system.

Spurious signals occurring in the first mixer is caused by the fact that harmonics of the first local oscillator frequency $f_{L1}$ and harmonics of the interference signal $f_U$ are mixed to produce a resultant frequency which falls in the first intemediate frequency $f_{IF1}$. This is expressed by:

$$|mf_{L1} \pm nf_U| = f_{IF1}$$

wherein m and n are 0, 1, 2 or 3.

In the above, harmonics of $f_{L1}$ and $f_U$ are considered to an order as high as the third order because further higher order harmonics are negligible unless the tuner characteristic against cross modulation distortion is poor. The following shows the above-mentioned interference components by way of the order of harmonics of the first local oscillator frequency $f_{L1}$.

(1) A case in which second and third order harmonics of the interference signal $f_U$ fall in the first intermediate frequency range:

$$2f_U, 3f_U$$

(2) A case in which the fundamental wave of the first local oscillator frequency $f_{L1}$ is mixed with second and third order harmonics of the intermediate signal $f_U$:

$$|f_{L1} \pm 2f_U|, |f_{L1} \pm 3f_U|$$

(3) A case in which the second harmonic of the first local oscillator frequency $f_{L1}$ is mixed with the fundamental wave, second and third order harmonics of the interference signal:

$$|2f_{L1} \pm f_U|, |2f_{L1} \pm 2f_U|, |2f_{L1} \pm 3f_U|$$

(4) A case in which the third harmonic of the first local oscillator frequency $f_{L1}$ is mixed with the fundamental wave, second and third order harmonics of the interference signal:

$$|3f_{L1} \pm f_U|, |3f_{L1} \pm 2f_U|, |3f_{L1} \pm 3f_U|$$

In order to analyse the above relationship, the input radio frequency ($f_R$) and the variable first local oscillator frequency ($f_{L1}$) are both normalized with respect to the first intermediate frequency $f_{IF1}$ to be expressed as follows:

$$F_1 = f_R/f_{IF1}$$

$$F_2 = f_{L1}/f_{IF1}$$

By using $F_1$ and $F_2$, spurious signal frequencies are generally obtained by using lines expressed by:

$$mF_1 + nF_2 = 1$$

wherein m and n are 0, $\pm 1$, $\pm 2$, $\pm 3$ ...

Figure 4:
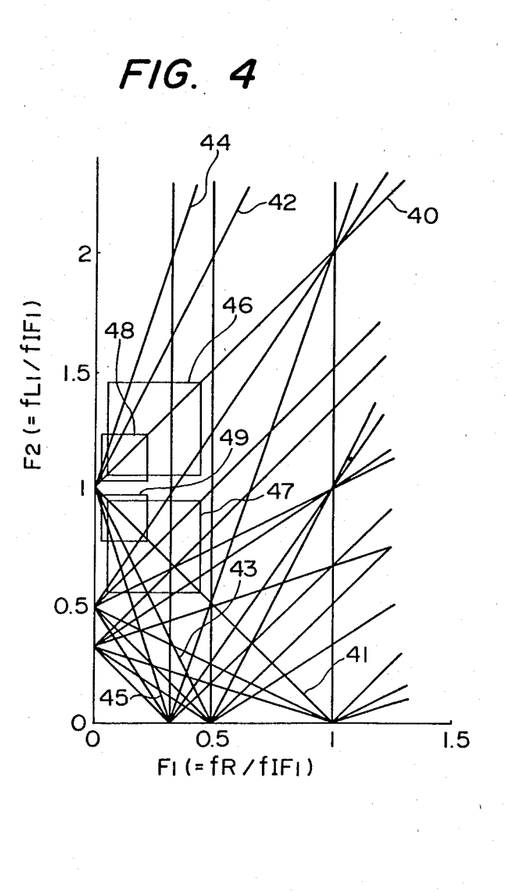
FIG. 4 is an explanatory diagram showing third or less order spurious signal frequency relationship.

FIG. 4 illustrates the frequency relationship causing spurious signals resulting from fundamental waves and harmonics of an order as high as third order. Since the first intermediate frequency $f_{IF1}$ is produced in response to a desired frequency $f_D$ by either $f_{IF1} = f_{L1} - f_D$ or $f_{IF1} = f'_{L1} - f_D$ depending on the method of mixing, the value of $f_{L1}$ or $f'_{L1}$ is constant to find the value of $F_2$. Under this condition it is determined whether an RF incoming signal having a frequency $f_R$ becomes a spurious signal or not by finding the value of $F_1$ at which a horizontal line of the constant $F_2$ intersects the lines expressed by $mF_1 + nF_2 = 1$ when the value of $F_1$ is changed between $F_{1min}$ and $F_{1max}$ where $F_{1min}$ is the lower limit ($=f_{Rmin}/f_{IF1}$) and $F_{1max}$ is the upper limit ($=f_{Rmax}/f_{IF1}$).

Actually, incoming RF signal frequencies do not in a continuous spectrum exist. Namely, incioming signal frequecies are spaced apart from one another by a predetermined frequency interval, such as 6 MHz. Therefore, another incoming channel signal becomes an interference signal apparing within the first intermediate frequency at a frequency range space apart from the first intermediate frequency by a frequency equal to the frequency difference between the intersecting point and a close point at which 6 MHz-spaced apart $F_1$ exists.

In FIG. 4, reference 40 is a line of $F_2 - F_1 = 1$, indicating a frequency relationship of a desired signal in the case $f_{IF1}$ is the difference between the first local oscillator frequency and the desired frequency as $f_{IF1} = f_{L1} = f_D$. The reference 41 indicates a line of $F_2 + F_1 = 1$, indicating a frequency relationship of a desired signal in the case $f_{IF1}$ is the sum of the first local oscillator frequency and the desired frequency as $f_{IF1} = f'_{L1} + f_D$. The reference 42 indicates a line of $F_2 - 2F_1 = 1$, while the reference 43 indicates a line of $F_2 + 2F_1 = 1$, where both have a relationship of $f_R = f_D/2$. The reference 44 indicates a line of $F_2 - 3F_1 = 1$, while the reference 45 indicates a line of $F_2 + 3F_1 = 1$, where both have a relationship of $f_R = f_D/3$. Spurious signals caused by the fact that harmonics of interference signals equal the desired frequency as shown by the lines 42–45 necessarily occur irrespective of the value of the first intermediate frequency and the method of mixing. Therefore, it is necessary to suppress such interference signals, at an RF input stage, causing spurious signals due to harmonics.

Taking into account the spurious signal frequencies execpt for those which necessarily occur and can be removed as indicated by lines 42 through 45, and except for the desired signals 40 and 41, the method of mixing in the first mixer has to be determined.

Assuming that the frequency range of interference signals is defined between $f_{Rmin} = 50$ MHz and $f_{Rmax} = 450$ MHz, a box or enclosure 46 of FIG. 4 indicates a frequency range to be considered where $f_{IF1} = 1$ GHz, which is produced as the difference between a desired signal frequency and the first local oscillator frequency; a box 47 indicating a frequency range to be considered where $f_{IF1} = 1$ GHz, which is produced as the sum of a desired signal frequency and the first local oscillator frequency; a box 48 indicating a frequency range to be considered where $f_{IF1} = 2$ GHz, which is produced as the difference between a desired signal frequency and the first local oscillator frequency; a box 49 indicating a frequency range to be considered where $f_{IF1} = 2$ GHz, which is produced as the sum of a desired signal frequency and the first local oscillator frequency.

When comparing boxes 46, 48 in which the above-mentioned frequency difference is used as $f_{IF1}$ with boxes 47, 49 in which the above-mentioned frequency sum is used as $f_{IF1}$, it will be understood that boxes 46, 48 encounter a smaller number of spurious signal frequency relationships than boxes 47, 49. Furthermore when comparing the power level of spurious signals between these two cases, it can be confirmed by way of simulation that the spurious signal power level in the case that $f_{IF1}$ equals the difference between the desired frequency and the first local oscillator frequency is lower than the other case. From the above, it will be understood that it is desirable to select the first intermediate frequency $f_{IF1}$ to the difference between the desired frequency and the first local oscillator frequency as $f_{IF1} = f_{L1} - f_R$ in view of spurious signal occurrence number or density and its level.

Figure 5:
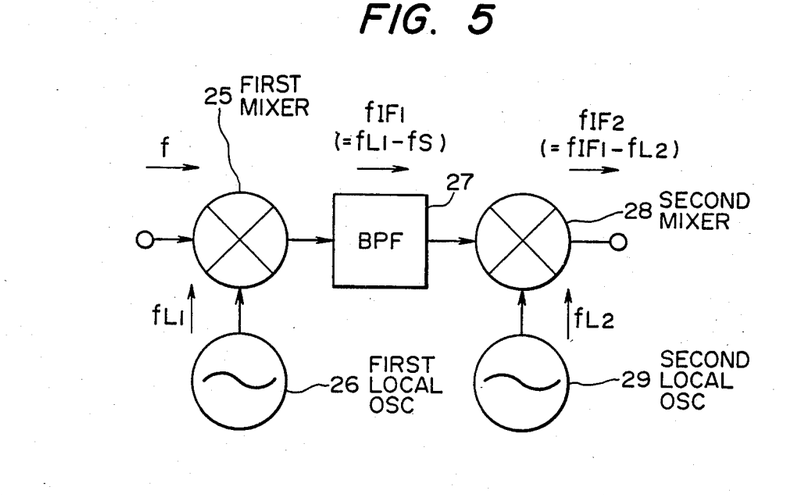
FIG. 5 is a schematic diagram showing the method of mixing in first and second mixers of the tuner according to the present invention.

FIG. 5 is a schematic diagram showing the above-mentioned method of mixing. In FIG. 5, the reference 25 indicates a first mixer; 26, a first local oscillator; 27, a bandpass filter; 28, a second mixer; and 29, a second local oscillator. When an RF incoming signal is processed in the double superheterodyne arrangement of FIG. 5, since the desired signal frequency is subtracted from the first local oscillator frequency, the frequency order within the received desired channel signal is reversed. Namely, the video intermediate frequency becomes higher than the audio intermediate frequency in the first intermediate frequency range $f_{IF1}$. In a following stage the first intermediate frequency is converted into the second intermediate frequency, which equals TV intermediate frequency. In order to effect frequency conversion without changing the above-mentioned frequency order, the second local oscillator frequency $f_{L2}$ is selected to be lower than the first intermediate frequency $f_{IF1}$ to obtain the second intermediate frequency $f_{IF2}$ as expressed by:

$$f_{IF2} = f_{IF1} - f_{L2}$$

Figure 6:
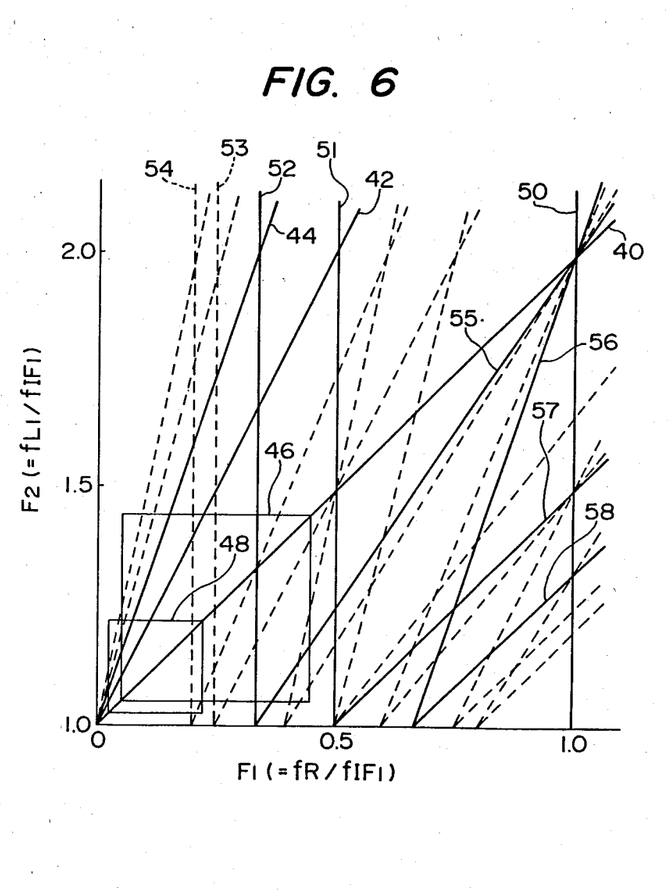
FIG. 6 is an enlarged diagram of FIG. 4, showing also higher order spurious signal frequency relationship.

Now let us consider as to the selection of the first intermediate frequency $f_{IF1}$. FIG. 6 is a chart showing spurious signal frequency relationship caused by fundamental waves and its harmonics of an order as high as fifth order in the case that the above-mentioned mixing method in which the first intermediate frequency $f_{IF1}$ is obtained by producing the difference between the first local oscillator frequency and the desired frequency. In FIG. 6, shown lines are expressed by $mF_1 + nF_2 = 1$ in the same manner as in FIG. 4. Those lines where the values m and n are both three or less, namely as high as third order, are shown by solid lines, while those lines where either of m and n is either 4 or 5, namely fourth or fifth order, and the other is 5 or less, namely, first through fifth order, are shown by dotted lines.

A line 40 is $F_2 - F_1 = 1$, indicating a desired wave; a line 42 being $F_2 - 2F_1 = 1$ indicating a frequency relationship of $f_R = f_d/2$; and a line 43 being $F_2 - 3F_1 = 1$ indicating a frequency relationship of $f_R = f_D/3$. A line 50 is $F_1 = 1$ indicating $f_R = f_{IF1}$, a line 51 being $2F_1 = 1$ indicating $f_R = f_{IF1}/2$, a line 52 being $3F_1 = 1$ indicating $f_R = f_{IF1}/3$, a line 53 being $4F_1 = 1$ indicating $f_R = f_{IF1}/4$, a line 54 being $5F_1 = 1$ indicating $f_R = f_{IF1}/5$, and these frequency relationships are the cases where harmonics of the interference singal directly equal $f_{IF1}$. A line 55 is $2F_2 - 3F_1 = 1$, a line 56 being $3F_1 - F_2 = 1$, a line 57 being $2F_2 - 2F_1 = 1$, and a line 58 being $3F_2 - 3F_1 = 1$.

In an equation of $mF_1 + nF_2 = 1$ wherein m an $n = 0$, $\pm 1, \pm 2, \ldots \pm k$, wherein $k = 2, 3 \ldots$, comparing $kF_1 = 1$ ($F_1 = 1/k$) with $mF_1 + nF_2 = 1(F_1 = (1 - nF_2)/2)$, the value of $F_1$ in the former is always smaller than the latter in ranges of $F_1 > 0$ and $F_2 > 1$ except for the case of $n = 1$. Namely, except for a desired signal of $n = 1$ and spurious signals of $f_R = f_D/a$ wherein $a = 2, 3 \ldots$, $F_1 = 1/k$, namely, $f_R = f_{IF1}/k$ wherein $k = 2, 3 \ldots$, occur at the lowest frequency among spurious signals of $k^{th}$ order or less. In the above, spurious signal frequency relationships which have to be actually considered reside in a range narrower than $F_1 > 0$ and $F_2 > 1$. Such a narrow range is shown by boxes 46 and 48 where the box 46 indicates a range when $fIF = 1$ GHz and the other box 48 indicates a range when $fIF = 2$ GHz. Such a range to be considered is given by $F_{1min}(=f_{Rmin}/f_{IF1}) > F_{1max}(=f_{Rmax}/f_{IF1})$, and $F_{2min}(=1 + f_{Rmin}/f_{IF1}) > F_2 > F_{2max}(=1 + f_{Rmax}/f_{IF1})$.

Therefore, except for spurious signals of $f_R = f_D/a$ wherein $a = 2, 3 \ldots$, spurious signals of $k^{th}$ or less order do not occur within the frequency range of the radio frequency incoming signal when it is assumed that k is not only an integer but also a positive number $k'$, namely, when $F_{1max} > 1/k'(k'f_{Rmax} > f_{IF1})$.

Nextly let us consider factors which determine the value of $k'$, namely the order of spurious signals which do not appear in the first intermediate frequency range. As main factors can be raised the following three. The way of mixing is assumed to be expressed by $f_{IF1} = f_{L1} - f_D$.

(1) Nonlinear distortion characteristics

Nonlinear distortion characteristics will be described by way of crossmodulation distortion characteristics. In the case that a tuner has a crossmodulation distortion characteristics of $-5$ dBm, i.e. cross modulation distortion of 1 percent occurs due to adjacent or next adjacent channel signals having a power level of $-5$ dBm, if the power level of the undesired signal is greater than the desired wave by 30 dB at the RF input signal, the power level of the desired wave is greater than a third order spurious signal by 25 dB or over at the first intermedieate frequency. Furthermore since the power level of a desired wave at the first intermediate frequency with respect to a fourth order spurious signal is over 50 dB, no problem occurs.

In the case that a tuner has a crossmodulation distortion characteristic of $-15$ dBm, such power level differene between the desired wave and interference signals at the input signal results in 10 dB or larger difference between the desired wave and a third order spurious signal at the first intermediate frequency, and in 40 dB or larger difference between the desired wave and a fourth order spurious signal.

(2) Filter Characteristics

In order to receive a desired wave, if the power level of interference signals can be reduced at the RF input stage, such reduction would be advantageous for reducing spurious signals. Since spurious signals caused from harmonics of interference signals as $f_R = f_D/a$ wherein $a = 2, 3 \ldots$, necessarily occur, while second and third order spurious signals also occur, these spurious signals are needed to be reduced by rejecting the incoming interference signals by way of an RF input filter. Since such an interference signal frequency is spaced apart from the desired frequency by $f_D - f_D/a$, a simple structure filter may be used if only spurious signals caused from such an interference signal is to be removed. However, when it is needed to remove other spurious signals by way of such an input filter, the structure thereof would be complex.

In the case that harmonics of an interference signal equals the first intermediate frequency as $f_R = f_{IF1}/k$ wherein $k = 2, 3 \ldots$, since both the desired wave and spurious signal reside in the receiving band, it is impossible to remove such an interference signal by way of an input filter. Therefore, the value of the first intemediate frequency has to be determined with the order k of spurious signals being selected such that such spurious signals do not appear in the first intermediate frequency range, while a sufficient crossmodulation distortion characteristic is ensured.

Considering beat frequencies, since a second order beat frequency is spaced apart from a desired frequency by $f_D$, a countermeasure thereagainst is readily taken. However, a third order intermodulation is only spaced apart from a desired frequency by only a frequency interval of 12 MHz (next adjacent channel) or 6 MHz (adjacent channel), it is difficult to handle it by way of an input filter. Therefore, it is needed to select the first intermediate frequency and to ensure a sufficient crossmodulation distortion characteristic.

Figure 7:
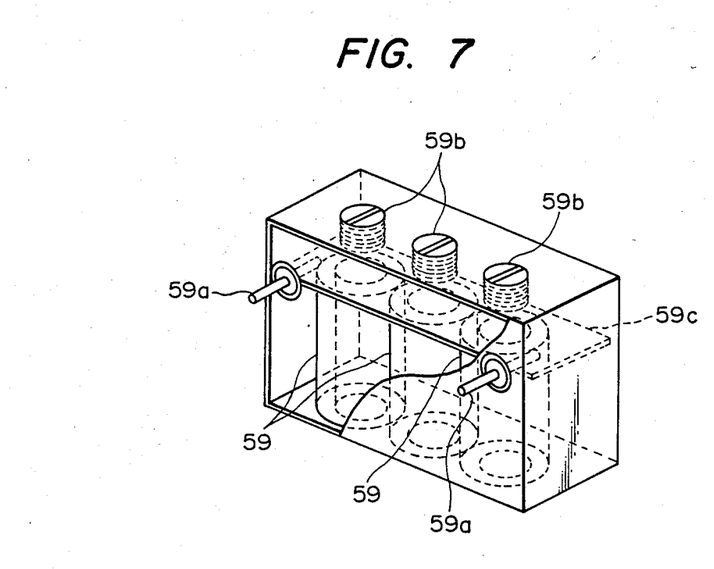
FIG. 7 is a perspective view showing a bandpass filter of dielectric type employed as a first intermediate frequency filter in the tuner according to the present invention.

Describing filter characteristics for the first intermediate frequency, it is necessary to employ a fixed-frequency filter for selectively passing only the first intermediate frequency among various signals produced by the first mixer so as to reduce interferences due to other channel signals in following stages. In order to actualize a filter of 1 to several GHz which is small in size and rejects other channel signals, a coaxial dielectric filter shown in FIG. 7 may be employed. The filter of FIG. 7 is a bandpass filter having a resonator using a dielectric material having a large specific inductive capacity and high value of Q. In detail, the specific inductive capacity is 35, and nonloaded Q is 800 when the outer diameter of the dielectric material 59 is 10 mm.

In FIG. 7, the reference 59a indicates input and output terminals; 59b, tuning screws; and 59c, a coupling substrate.

(3) Frequency dependence of various characteristics

When the first intermeidate frequency is selected to a high value, the first local oscillator frequency is also high. Generally speaking, the gain of a transistor with respect to frequency is −6 dB/oct, while noise figure (NF) deteriorates as the frequency increases such that NF = 1.8 dB at 1 GHz changes to NF = 2.5 dB at 2 GHz for instance. Furthermore, from an industrial viewpoint higher frequency suffers from various problems or disadvantages relating to manufacturing techniques and manufacturing cost.

Considering the above factors, it is desirable to select the value of k' as follows. In determining the value of k', the following situation has to be considered. Namely, since the amplitude of a desired frequency with respect to spurious signals at the first intermediate frequency is needed to be over 45 dB so that a satisfactory picture can be obtained on TV CRT, a third order spurious signal and a second order spurious signal, which is stronger than the third order one, have to be removed by way of an RF input filter when the tuner has a crossmodulation distortion characteristic of −5 dBm as described in the above, while fourth or higher order spurious signals can be negligible. However, it is difficult to remove all the spurious signals by way of an RF input filter depending on the frequency of the interference signal causing such spurious signals.

Therefore, the value of k' is selected so that k' > 3 as described in the above so that spurious signals of third or less order do not occur in the first intermediate frequency range exeecept for spurious signals $f_R = f_D/a$ which necessarily occur. As k' is determined by k' > 3, the first intermediate frequency is selected to satisfy $3f_{Rmax} < f_{IF1}$. For instance, when $f_{Rmax} = 450$ MHz, 1350 MHz $< f_{IF1}$. In the above, if $f_{IF1}$ is seletect to an extremely high value, such an extremely high $f_{IF1}$ suffers from deterioration in gain and NF. Accordingly, $f_{IF1}$ is preferably close to $3f_{Rmax}$ such as $3f_{Rmax} < f_{IF1} < 3.4f_{Rmax}$ Furthermore, in the case that the crossmodulation distortion characteristic of a tuner is worse than −5 dBm, for instance at −15 dBm as described in the above, it is needed to set as k' < 4 because the power level of the desired signal with respect to a fourth order spurious signal cannot be greater than 45 dB. In this way the value of k' may be increased depending on the crossmodulation distortion characteristic of a used tuner. However, even taking into account a relatively poor crossmodulation distortion characteristic, the value of k' is set as k < 5. Namely, it is unnecessary to prevent sixth or higher spurious signals from appearing in the first intermediate frequency range because other problems would occur due to increase in the power level of beat frequencies caused from poor crossmodulation distortion characteristic or due to such a high first intermediate frequency.

From the above first intermediate frequency is selected as $5f_{Rmax} > f_{IF1}$. For instance, when $f_{Rmax} = 450$ MHz, $f_{IF} < 2,250$ MHz. In this way in the case that the characteristic of the tuner against crossmodulation distortion is poor, if the first intermediate frequency is selected high when beat frequencies can be removed by an input filter, a tuner having superior characteristic against spurious signals can be constructed although tuner gain and noise figure are contrary to the crossmodulation distortion characteristics.

As described in the above, the value of k' is selected as $3 < K' < 5$, namely the first intermediate frequency is determined as $3f_{Rmax} < f_{IF1} < 5f_{Rmax}$. In other words, the first intermediate frequency is selected to a value which is between 3 and 5 times the upper limit of the RF incoming signal or the receiving range. The value of $f_{IF1}$ is actually determined within the above range taking into account the crossmodulation distortion characteristic, input filter frequency or the like so that a most suitable one is determined in accordance with each case.

An embodiment of the present invention will be described in detail hereinafter.

Figure 8:
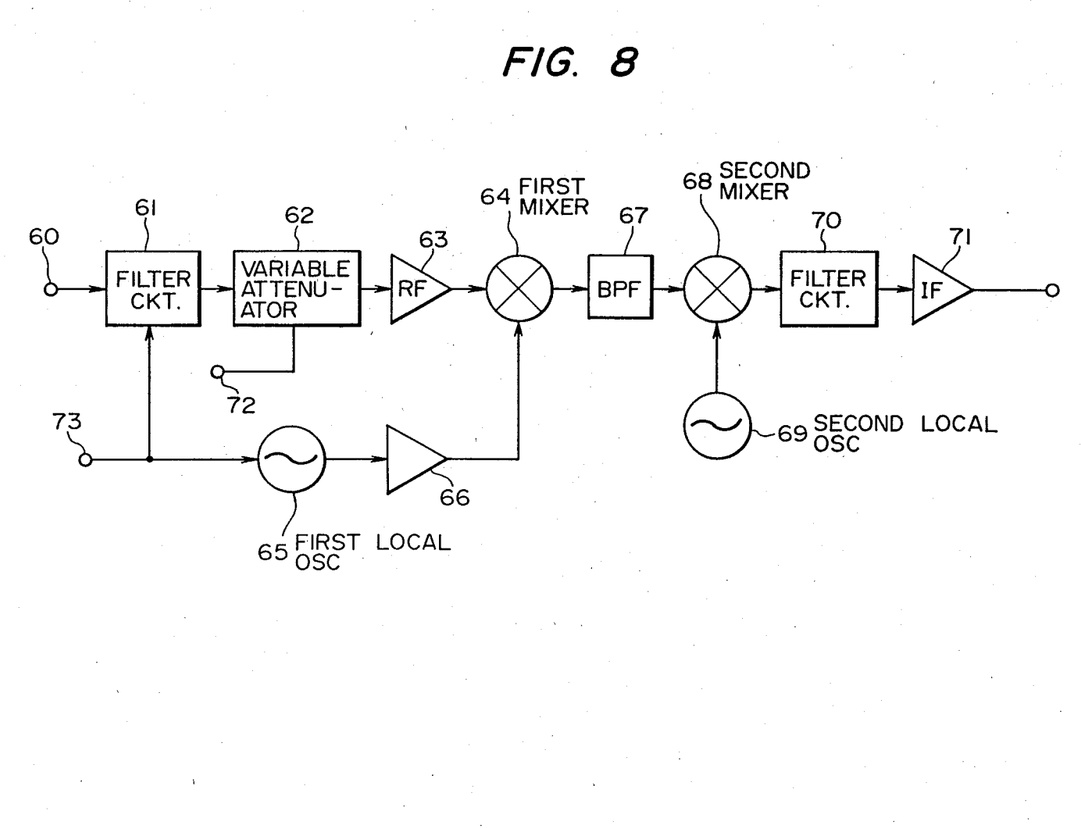
FIG. 8 is a schematic diagram showing an embodiment of the tuner according to the present invention.

FIG. 8 shows a block diagram of a tuner of double superheterodyne system used as a CATV converter. An RF incoming signal inputted through an input terminal 60 is applied to an RF input filter 61 which comprises a trap circuit for removing FM broadcasting signals or the like, and a bandpass filter. The bandpass filter of the RF input filter 61 has a varactor (not shown) which is responsive to a tuning voltage from a terminal 73 so that freqeuncy characteristic thereof can be changed in accordance with a desired tuning frequency. With this arrangement the frequency characteristic of the RF input filter can be continuously charged depending on the tuning frequency. If desired however, the RF input filter may be constructed such that the frequency characteristic thereof can be switched through two or more modes to select one of a plurality of characteristics in accordance with a switching signal (not shown) which may be obtained from a signal indicative of a desired tuning frequency.

An output signal from the RF input filter 61 is applied to a variable attenuator 62 comprising a p-i-n diode. The degree of the loss at the pass band of the variable attenuator 62 is approximately 1 to 1.5 dB, while the maximum attenuation amount is approximately 50 dB. An output signal from the variable attenuator 62 is amplified by an RF amplifier 63, and is then applied to an input terminal of a first mixer 64 comprising a single-balance mixing diode. The first mixer 64 has another input terminal for receiving a first local oscillator frequency which is produced by a voltage controlled oscillator 65 and a following amplifier 66 which amplifies an output signal from the voltage controlled oscillator 65 to a given level. The voltage controlled oscillator 65 produces the first local oscillator frequency with its input voltage being controlled by the tuning voltage from the terminal 73, where the first local oscillator frequency has a predetermined relationship with a desired channel signal frequency. The first mixer effects mixing to convert the frequency of incoming TV signals into a first intermediate frequency $f_{IF1}$ given by $3f_{Rmax} < f_{IF1} < 5f_{Rmax}$. Namely, in the case that the upper limit of the receiving frequency range is 450 MHz, $f_{IF1}$ is between 1350 MHz and 2250 MHz. The method of mixing is such that the difference between the first local oscillator frequency $f_{L1}$ and the desired TV channel frequency equals the first intermediate frequency $f_{IF1}$, and therefore necessary oscillating frequency of the voltage-controlled oscillator 65 is arranged to vary between 1550 MHz and 1950 MHz.

Assuming that the first intermediate frequency $f_{IF1}$ is set to 1500 MHz, an output signal from the first mixer 64 is fed via a fixed-frequency bandpass filter 67 to an input terminal of a second mixer 68. The bandpass filter 67 is a coaxial dielectric filter having a passband of 5 MHz so as to effectively suppress interferences by adjacent channel signals in the following circuits. The second mixer 68 has another input terminal for receiving a second local oscillator frequency from a second local oscillator 69 which oscillates at a fixed frequency. The second mixer effects mixing to convert the first intermedieate frequency $f_{IF1}$ to a second intermediate frequency $f_{IF2}$. The way of mixing in the second mixer 68 may be such that the second local oscillator 69 frequency is subtracted from the first intermediate frequency $f_{IF1}$ to produce the second intermediate frequency $f_{IF2}$.

An output signal from the second mixer 69 is fed via a filter circuit 70 to an intermediate frequency amplifier 71. The filter circuit 70 comprises a fixed-frequency bandpass filter and a trap circuit for selecting only the second intermediate frequency $f_{IF2}$ and to reject or attenuate video carrier signal and an audio carrier signal of upper and lower adjacent channels. The intermediate frequency amplifier 71 amplifies the second intermediate frequency signal passed through the filter circuit 70 to a given level.

In FIG. 8, a terminal 72 is for supplying an AGC voltatge to the variable attenuator 62 used for automatic gain control.

In the above embodiment, although the fixed-frequency filter 67 has been described as a bandpass filter of coaxial dielectric type, other type filter may be used therefor if desired.

From the above it will be understood that low order spurious signals can be effectively suppressed, to provide a small double superheterodyne tuner which is superior in spurious signal characteristics and is advantageous in manufacturing. Namely, since the first intermediate frequency is set to a relatively high value as described in the above in accordance with the present invention, various circuit elements may be readily constructed of integrated circuits, or microstriplines, and therefore the entire tuner may be small in size while the tuner is almost free from frequency adjustment.

The above-described embodiment is just an example of the present invention, and therefore, it will be apparent for those skilled in the art that many modifications and variations may be made without departing from the spirit of the present invention.

What is claimed is:

1. A double superheterodyne tuner comprising:
   (a) an input filter having a frequency response for selectively passing a desired signal with the frequency response thereof being changed in accordance with a desired tuning frequency;
   (b) a first local oscillator for producing a first local oscillator frequency having a predetermined frequency difference from that of said desired signal;
   (c) a first mixer responsive to an output signal from said input filter and said first local oscillator frequency for producing a first intermediate frequency which is larger than $3f_{Rmax}$ and is smaller than $3.4f_{Rmax}$ wherein $f_{Rmax}$ is the upper limit of a receiving range of said tuner, the mixing by said first mixer being such that said first intermediate frequency is produced by subtracting the desired signal frequency from said first local oscillator frequency which is higher than said first intermediate frequency;
   (d) a fixed-frequency filter for passing said first intermediate frequency from said first mixer;
   (e) a second local oscillator for producing a predetermined second local oscillator frequency having a predetermined frequency difference from said first intermediate frequency;
   (f) a second mixer responsive to an output signal from said fixed-frequency filter and said second local oscillator frequency for producing a second intermediate frequency.

2. A double superheterodyne tuner as claimed in claim 1, wherein said receiving range is between 50 MHz and 450 MHz.

3. A double superheterodyne tuner as claimed in claim 1, wherein said input filter comprises a trap circuit for rejecting FM broadcasting signals, and a bandpass filter having a varactor diode with which the frequency response can be changed.

4. A double superheterodyne tuner as claimed in claim 1, wherein the way of mixing by said second mixer being such that said second intermediate frequency is produced by subtracting said second local oscillator frequency from said first intermediate frequency which is higher than said second local oscillator frequency.

5. A double superheterodyne tuner as claimed in claim 1, wherein said fixed-frequency filter comprises a bandpass filter of dielectric type.

6. A double superheterodyne tuner as claimed in claim 5, wherein said bandpass filter is a coaxial dielectric filter.

7. A double superheterodyne tuner as claimed in claim 1, wherein said tuner is arranged to receive CATV signals.

* * * * *